(12) United States Patent
Tomita et al.

(10) Patent No.: US 10,830,834 B2
(45) Date of Patent: Nov. 10, 2020

(54) CURRENT MEASURING MODULE USING INSPECTION SUBSTRATE AND INSPECTION SUBSTRATE

(71) Applicant: EBARA CORPORATION, Tokyo (JP)

(72) Inventors: Masaki Tomita, Tokyo (JP); Hiroyuki Takenaka, Tokyo (JP); Mitsutoshi Yahagi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 36 days.

(21) Appl. No.: 16/245,154

(22) Filed: Jan. 10, 2019

(65) Prior Publication Data

US 2019/0219627 A1  Jul. 18, 2019

(30) Foreign Application Priority Data

Jan. 18, 2018 (JP) ................. 2018-006570

(51) Int. Cl.
*G01R 31/04* (2006.01)
*G01R 31/66* (2020.01)
*G01R 1/073* (2006.01)

(52) U.S. Cl.
CPC ......... *G01R 31/66* (2020.01); *G01R 1/07314* (2013.01)

(58) Field of Classification Search
CPC ............ G01R 31/26; G01R 31/2642; G01R 31/2648; G01R 31/2831; G01R 31/31702
See application file for complete search history.

(56) References Cited

U.S. PATENT DOCUMENTS

| | | | | |
|---|---|---|---|---|
| 3,493,858 A | * | 2/1970 | Baron | G01R 1/0735 324/72.5 |
| 7,091,733 B2 | * | 8/2006 | Takekoshi | G01R 1/0433 324/750.03 |
| 2014/0368229 A1 | * | 12/2014 | Arai | G01R 31/2874 324/756.03 |
| 2015/0276835 A1 | | 10/2015 | Minami | |

FOREIGN PATENT DOCUMENTS

JP   2005-146399 A   6/2005
JP   2015-200017 A   11/2015

* cited by examiner

*Primary Examiner* — Tung X Nguyen
(74) *Attorney, Agent, or Firm* — BakerHostetler

(57) ABSTRACT

A current measuring module for measuring a current flowing through the substrate holder using an inspection substrate is provided. The substrate holder includes a plurality of holder electric contacts. The plurality of holder electric contacts contact a substrate to supply the held substrate with a current. The substrate holder holds the inspection substrate for measuring the current flowing through the substrate holder. The plurality of holder electric contacts contact a plurality of respective independent substrate electric contacts disposed on the inspection substrate. The inspection substrate includes a plurality of measurement points connected to the plurality of respective substrate electric contacts with wirings and substrate side connectors electrically connected to the plurality of measurement points. The current measuring module includes a plurality of inspection probes configured to contact the plurality of respective measurement points on the inspection substrate.

5 Claims, 12 Drawing Sheets

CURRENT MEASURING MODULE USING INSPECTION SUBSTRATE AND INSPECTION SUBSTRATE

CROSS-REFERENCE TO RELATED APPLICATION

This application is based upon and claims the benefit of priority of the prior Japanese Patent Application No. 2018-006570, filed on Jan. 18, 2018, the entire contents of which are incorporated herein by reference.

TECHNICAL FIELD

This application relates to a current measuring module using an inspection substrate and the inspection substrate.

BACKGROUND ART

There has been known a plating apparatus that holds a substrate such as a semiconductor wafer with a substrate holder and immerses the substrate into a plating solution in a plating tank. As illustrated in FIG. 12, the substrate holder includes a plurality of inner contacts 100 in contact with a peripheral edge portion of a substrate W and a plurality of outer contacts 101 each connected to these inner contacts 100. Wirings 104 that connect the plurality of inner contacts 100 and the plurality of outer contacts 101 together are located inside the substrate holder. When the substrate holder is located at a predetermined position in the plating tank, the outer contacts 101 are brought into contact with a power feeding terminal 103 connected to a power supply 105. A current passes through the outer contacts 101 and the inner contacts 100 and then flows through the substrate W, and a metal layer is formed on a surface of the substrate W under the presence of the plating solution.

An extremely high or an extremely low electrical resistance between one inner contact 100 and the substrate W (hereinafter simply referred to as an electrical resistance of the inner contact 100) results in non-uniform currents flowing through the plurality of inner contacts 100 and possibly causes a problem in uniformity of a layer thickness in the substrate surface. There have been techniques that measure a resistance value to a current flowing from inner contacts of a substrate holder to a substrate as a plated object held to the substrate holder to inspect the substrate and the substrate holder (for example, PTL 1 and PTL 2).

CITATION LIST

Patent Literature

PTL 1: Japanese Unexamined Patent Application Publication No. 2015-200017
PTL 2: Japanese Unexamined Patent Application Publication No. 2005-146399

SUMMARY OF INVENTION

Technical Problem

While a substrate as a plated object is held to a substrate holder, PTL 1 measures an electrical resistance to a current flowing from one electric contact of the substrate holder to another electric contact of the substrate holder through the substrate. The electrical resistance in an allowable range is determined as a normal state, and the electrical resistance outside the allowable range is determined as an abnormal substrate or substrate holder. The abnormality in electrical resistance occurs mainly by two causes. The one is a factor on the substrate side. For example, when a conductive layer (seed layer) is not uniformly formed on the surface of the substrate, when an unnecessary matter generated when a resist is applied over the substrate remains on the substrate, and when the surface of the substrate is oxidized, the electrical resistance possibly becomes abnormal. Another one is a factor on the substrate holder side. For example, when an inner contact of the substrate holder deforms, a foreign matter such as a resist attaches to the inner contact of the substrate holder, and when a plating solution attaches to the inner contact of the substrate holder, the electrical resistance possibly becomes abnormal. However, even when the electrical resistance becomes abnormal, the method disclosed in PTL 1 cannot determine whether the abnormality is caused in the substrate or in the substrate holder. For example, when the substrate holder is abnormal and the substrate itself is not abnormal, replacing the substrate holder allows performing the normal plating process. When the substrate is abnormal and the substrate holder is not abnormal, replacing the substrate allows performing the normal plating process on another substrate. However, to make such determination, whether the cause of the abnormality of the electrical resistance is in the substrate side or in the substrate holder side needs to be found out. Therefore, one object of this application is to allow a detection of an abnormality in an electrical resistance generated by a cause occurred in a substrate holder.

Solution to Problem

[Configuration 1]
According to a configuration 1, a current measuring module for measuring a current flowing through a substrate holder using an inspection substrate is provided. The substrate holder includes a plurality of holder electric contacts. The plurality of holder electric contacts are configured to contact a substrate to supply the held substrate with a current. The substrate holder is configured to hold the inspection substrate for measuring the current flowing through the substrate holder. The plurality of holder electric contacts contact a plurality of respective substrate electric contacts disposed on the inspection substrate while the inspection substrate is held. The plurality of substrate electric contacts are electrically independent. The inspection substrate includes a plurality of measurement points connected to the plurality of respective substrate electric contacts with wirings and substrate side connectors electrically connected to the plurality of measurement points. The current measuring module includes a plurality of inspection probes configured to contact the plurality of respective measurement points on the inspection substrate held to the substrate holder and measurement side connectors electrically connected to the plurality of inspection probes. When the substrate side connectors and the measurement side connectors are connected, each of the plurality of measurement points on the inspection substrate and each of the plurality of respective inspection probes is electrically connected.

[Configuration 2]
According to a configuration 2, in the current measuring module according to the configuration 1, a voltage with a magnitude identical to a magnitude of a voltage applied to the substrate when the substrate is electroplated is applied from the holder electric contacts of the substrate holder to the substrate electric contacts, the wirings, and the measurement points to measure the current flowing through the substrate holder.

[Configuration 3]

According to a configuration 3, in the current measuring module according to the configuration 1 or 2, the respective wirings that connect the plurality of substrate electric contacts to the plurality of respective measurement points of the inspection substrate have an equal length.

[Configuration 4]

According to a configuration 4, in the current measuring module according to any one of the configuration 1 to the configuration 3, the substrate holder includes a plurality of contact holding members electrically independent from one another. The plurality of holder electric contacts are disposed on the respective contact holding members.

[Configuration 5]

According to a configuration 5, an inspection substrate used for measuring a current flowing through a substrate holder is provided. The inspection substrate includes a plurality of substrate electric contacts, a plurality of measurement points, a plurality of wirings, and substrate side connectors. The plurality of substrate electric contacts are located on an outer part of a surface of the inspection substrate. The plurality of substrate electric contacts are electrically independent. The plurality of measurement points are located on an inner part of the surface of the inspection substrate. The plurality of wirings connect the plurality of substrate electric contacts to the plurality of respective measurement points. The substrate side connectors are electrically connected to the plurality of measurement points.

[Configuration 6]

According to a configuration 6, a current measuring module for measuring a current flowing through a substrate holder using an inspection substrate is provided. The substrate holder includes a plurality of holder electric contacts. The plurality of holder electric contacts are configured to contact a substrate to supply the held substrate with a current. The substrate holder is configured to hold the inspection substrate for measuring the current flowing through the substrate holder. The plurality of holder electric contacts contact a plurality of respective substrate electric contacts disposed on the inspection substrate while the inspection substrate is held. The inspection substrate has a surface coated with an insulating layer. The insulating layer has a plurality of holes. The inspection substrate includes a conducting layer exposed from the plurality of holes. The current measuring module includes inspection probes configured to contact the conducting layer of the inspection substrate held to the substrate holder through the holes.

[Configuration 7]

According to a configuration 7, an inspection substrate used for measuring a current flowing through a substrate holder is provided. The inspection substrate includes a plurality of substrate electric contacts located on an outer part of a surface of the inspection substrate. The plurality of substrate electric contacts are electrically independent. The inspection substrate has the surface coated with an insulating layer. The insulating layer has a plurality of holes. The inspection substrate includes a conducting layer exposed from the plurality of holes.

DESCRIPTION OF EMBODIMENTS

Figure 1:
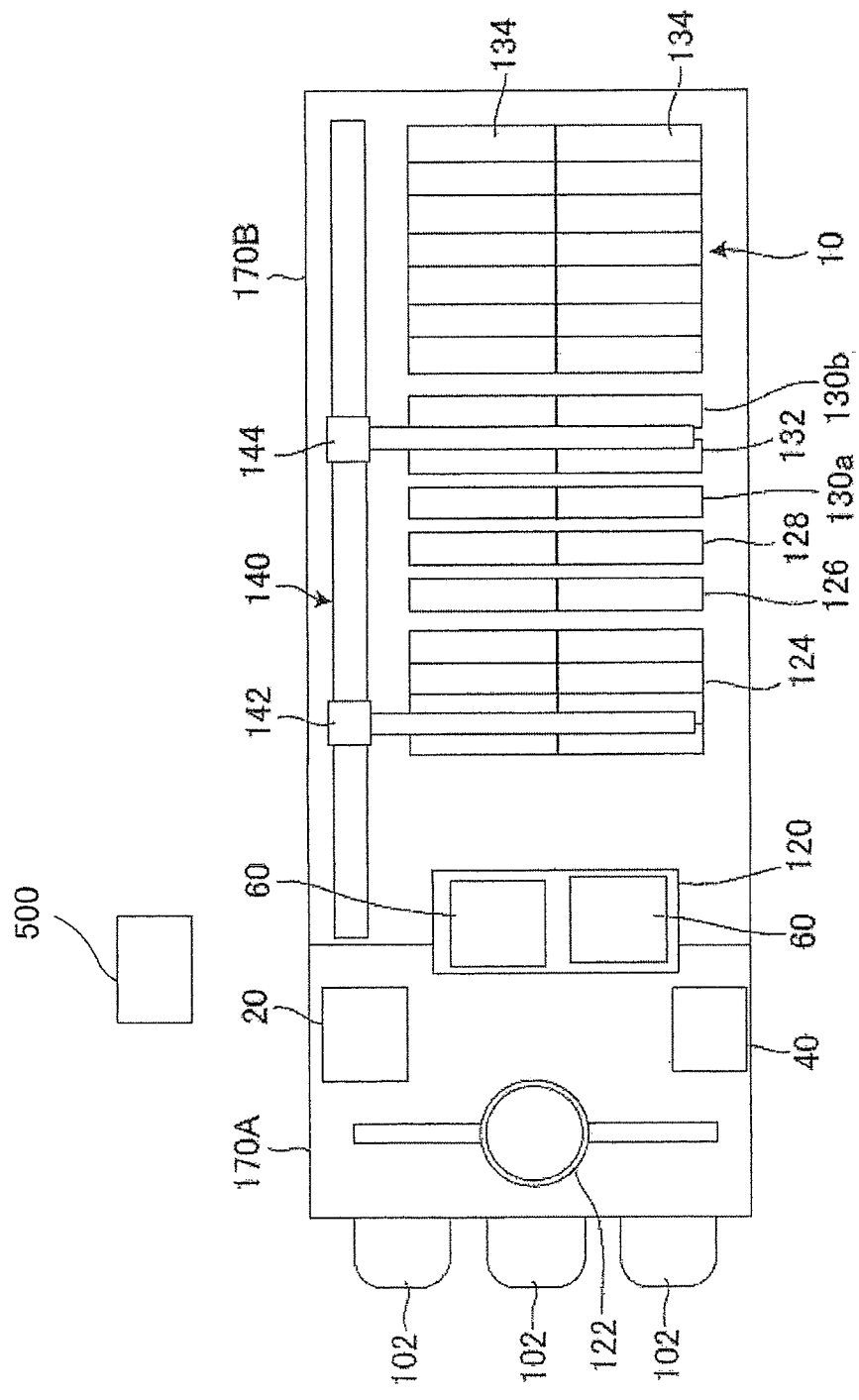
FIG. 1 is an entire layout drawing of a plating apparatus according to one embodiment.

The following describes embodiments of a plating apparatus, a substrate holder, a current measuring module, and a method for inspection of the substrate holder according to the present invention with the attached drawings. In the attached drawings, identical or similar reference numerals are attached to identical or similar components, and overlapping description regarding the identical or similar components may be omitted in the description of the respective embodiments. Features shown in the respective embodiments are applicable to other embodiments in so far as they are consistent with one another.

FIG. 1 is an entire layout drawing of the plating apparatus according to one embodiment. As illustrated in FIG. 1, this plating apparatus is roughly divided into a loading/unloading unit 170A that loads a substrate to a substrate holder 60 or unloads the substrate from the substrate holder 60, and a processing unit 170B that processes the substrate.

The loading/unloading unit 170A includes three FOUPs (Front-Opening Unified Pods) 102, an aligner 40, and a spin rinse dryer 20. The aligner 40 aligns a position of, for example, an orientation flat or a notch of the substrate in a predetermined direction. The spin rinse dryer 20 rotates the substrate after a plating process at a high speed for drying. The FOUPs 102 house the plurality of substrates such as semiconductor wafers in multiple stages. A fixing unit 120 on which the substrate holders 60 are placed to attach and remove the substrate is disposed near the spin rinse dryer 20. A substrate conveying device 122 formed of a robot for conveyance that conveys the substrate between these units is located at the center of these units 102, 40, 20, and 120.

The fixing unit 120 is configured such that the two substrate holders 60 are placeable. On the fixing unit 120, after the substrate is delivered between the one substrate holder 60 and the substrate conveying device 122, the substrate is delivered between the other substrate holder 60 and the substrate conveying device 122.

The processing unit 170B in the plating apparatus includes a stocker 124, a prewet tank 126, a presoak tank 128, a first cleaning tank 130a, a blow tank 132, a second cleaning tank 130b, and a plating tank 10. The substrate holder 60 is stored and temporarily placed in the stocker 124. In the prewet tank 126, the substrate is immersed into pure water. In the presoak tank 128, an oxide layer on a surface of a conducting layer such as a seed layer formed on the surface of the substrate is removed by etching. In the first cleaning tank 130a, the substrate after the presoak is cleaned together with the substrate holder 60 with cleaning fluid (for example, pure water). In the blow tank 132, the liquid is drained from the substrate after the cleaning. In the second cleaning tank 130b, the substrate after plating is cleaned together with the substrate holder 60 with cleaning fluid. The stocker 124, the prewet tank 126, the presoak tank 128, the first cleaning tank 130a, the blow tank 132, the second cleaning tank 130b, and the plating tank 10 are located in this order.

The plating tank 10, for example, includes a plurality of plating cells 134 including overflow tanks. The plating cells 134 each internally house one substrate and immerse the substrates into plating solutions held inside the plating cells 134. Applying a voltage between the substrate and an anode in the plating cell 134 performs plating such as copper plating on the substrate surface. For example, in the case of Through Silicon Via (TSV) plating, a barrier layer and/or an adhesive layer (for example, Ta, Ti, TiW, TiN, TaN, Ru, Co, Ni, and W) and a seed layer (for example, Cu, Ru, Ni, and Co) may be formed on a depressed portion on the substrate before the plating.

The plating apparatus includes a substrate holder conveyance device 140 employing, for example, a linear motor system that is positioned at the side of these respective devices and conveys the substrate holders 60 together with the substrates between these respective devices. This substrate holder conveyance device 140 includes a first transporter 142 and a second transporter 144. The first transporter 142 is configured so as to convey the substrates between the fixing unit 120, the stocker 124, the prewet tank 126, the presoak tank 128, the first cleaning tank 130a, and the blow tank 132. The second transporter 144 is configured so as to convey the substrates between the first cleaning tank 130a, the second cleaning tank 130b, the blow tank 132, and the plating tank 10. Another embodiment may be configured as follows. The plating apparatus includes only any one of the first transporter 142 and the second transporter 144, and any of the transporters conveys the substrates between the fixing unit 120, the stocker 124, the prewet tank 126, the presoak tank 128, the first cleaning tank 130a, the second cleaning tank 130b, the blow tank 132, and the plating tank 10.

The plating apparatus includes a control device 500 to control behaviors of the entire plating apparatus. The control device 500 can include, for example, a general-purpose computer or a dedicated computer including, for example, an input/output device, a display device, and a storage device, and programs to control the behaviors of the plating apparatus are configured to be installed on the control device 500. The control device 500 can cause the plating apparatus to behave in a plating process mode and a maintenance mode. The plating process mode is configured as a mode for the plating process on the substrate, and the maintenance mode is configured as a mode for maintenance of the plating apparatus, for example, maintenance of the substrate holder.

Figure 2:
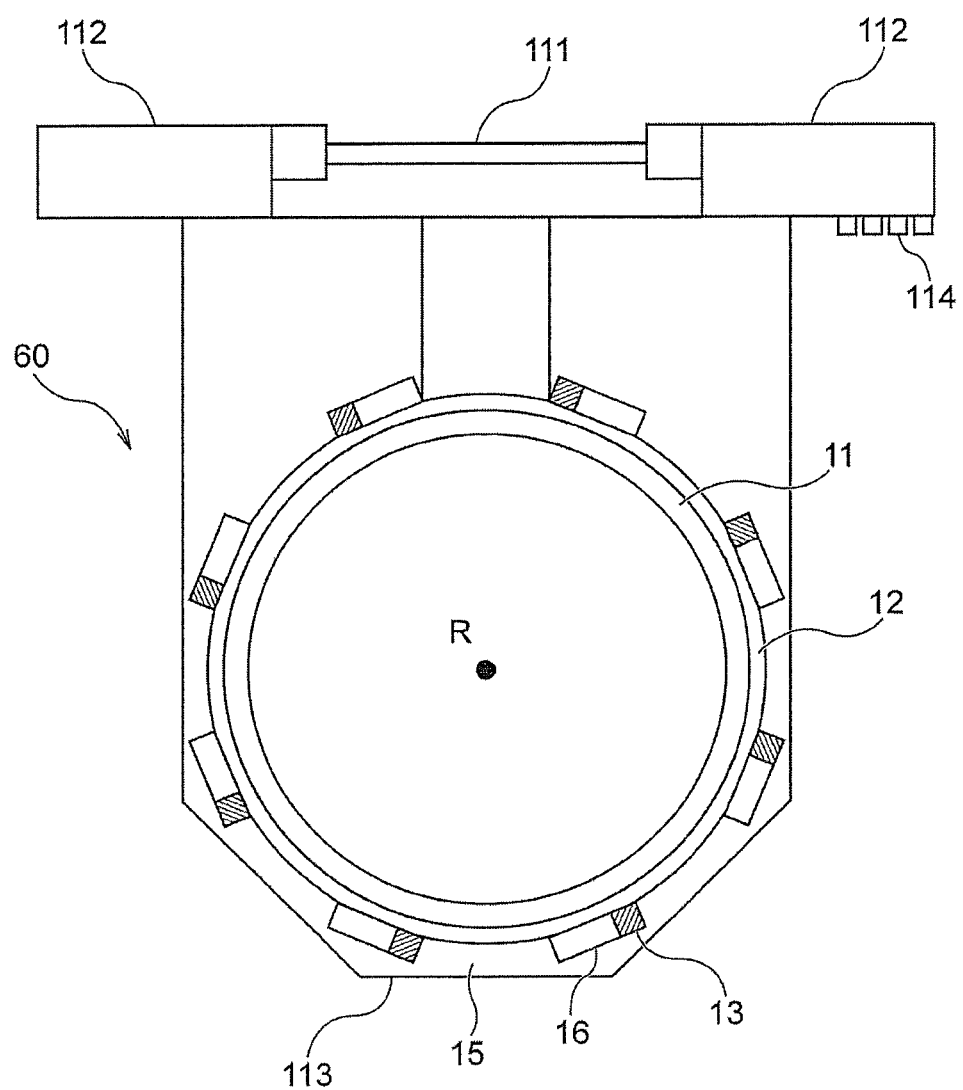
FIG. 2 is a top view illustrating a substrate holder in which a movable holding member is mounted to a fixing holding member and ear portions and dampers are fitted according to the one embodiment.
Figure 3A:
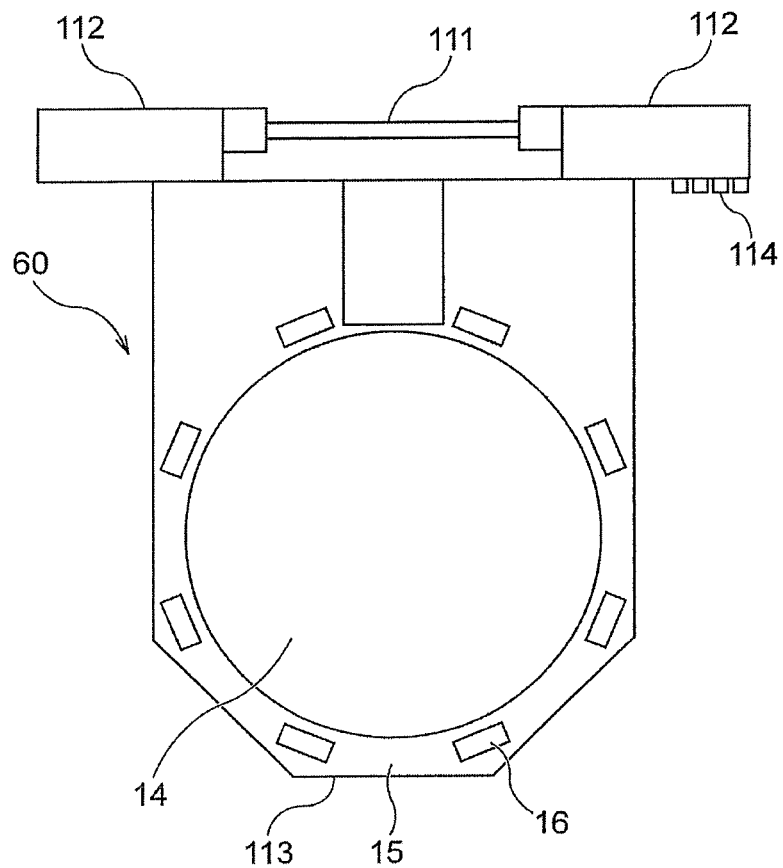
FIGS. 3A and 3B are top views separately illustrating the movable holding member and the fixing holding member of the substrate holder according to the one embodiment.
Figure 3B:
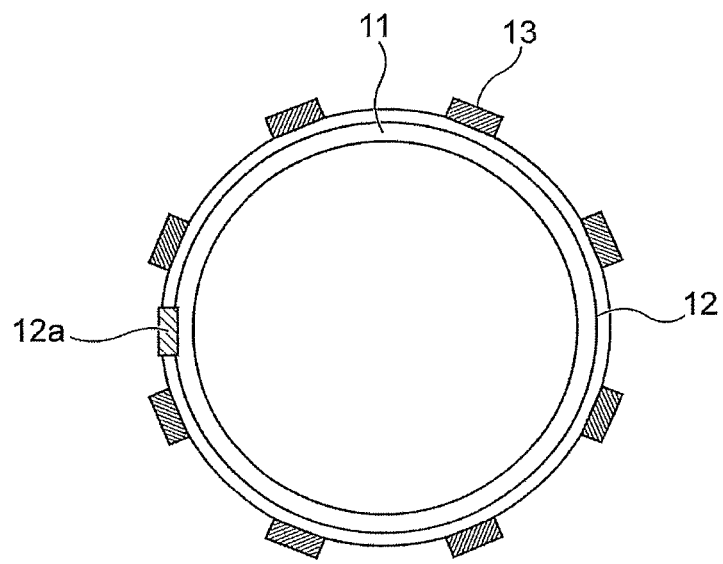
Figure 4:
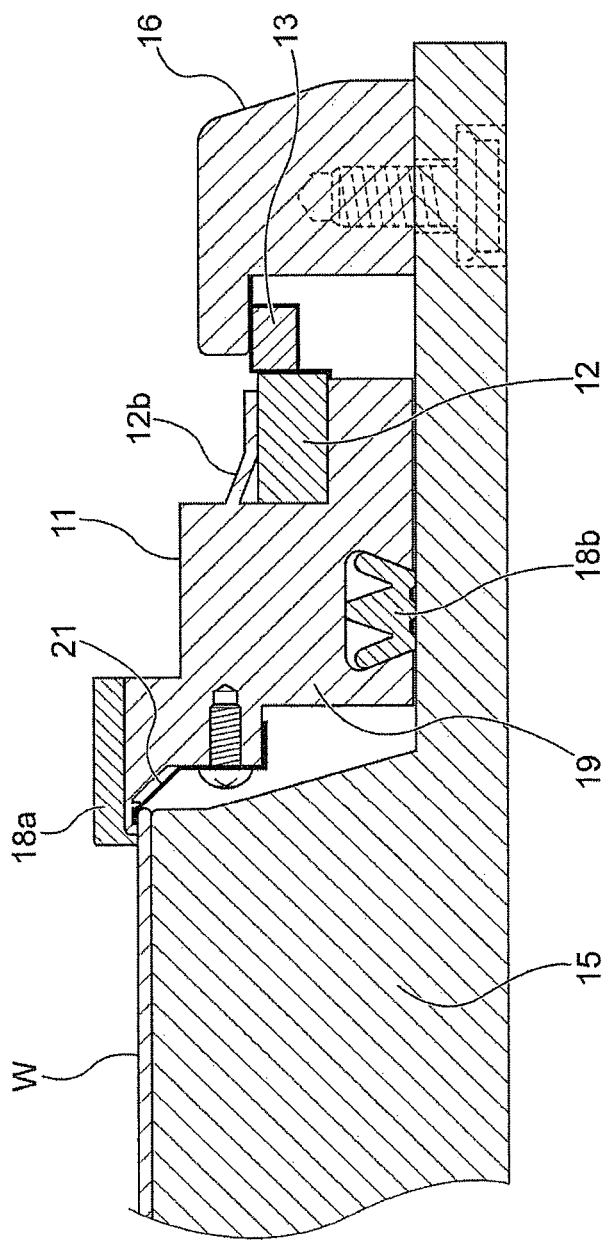
FIG. 4 is an outline drawing illustrating a configuration of the substrate holder that can be used in the plating apparatus according to the one embodiment.

FIG. 2 to FIG. 4 are outline drawings illustrating the configuration of the substrate holder 60 that can be used in the plating apparatus according to the one embodiment of the present invention. FIG. 2 is a top view illustrating a state where a movable holding member 11 is mounted to a fixing holding member 15 and ear portions 13 and dampers 16 are fitted. FIGS. 3A and 3B are top views separately illustrating the movable holding member 11 and the fixing holding member 15. FIG. 3A illustrates the fixing holding member 15 and FIG. 3B illustrates the movable holding member 11. FIG. 4 is a cross-sectional view of a part of the movable holding member 11 and the fixing holding member 15.

The substrate holder 60 has a handlebar 111 at one end. The handlebar 111 is held by the substrate holder conveyance device 140. The handlebar 111 has a round bar shape to be rotatable when the substrate holder 60 changes its posture from the vertical state to a horizontal state or from the horizontal state to the vertical state.

The handlebar 111 is preferably made of stainless steel having a high resistance to corrosion in case of an attachment of the plating solution. In the case where even the stainless steel cannot bear the corrosion caused by the plating solution, performing chrome plating or a coating with, for example, TiC on the surface of the stainless steel is recommend to increase the resistance to corrosion. A titanium highly resistant to the corrosion is also usable for the handlebar 111.

Rectangular parallelepiped shaped or cube shaped hanger portions 112 are disposed on both upper ends of the substrate holder 60. When the substrate holder 60 is located in the respective process tanks, locating the hanger portions 112 on hangers receiving member (not illustrated) causes the hanger portions 112 to function as supporting portions to suspend the substrate holder 60. Hooking the hanger portions 112 on a top surface of a peripheral wall of the stocker 124 in the stocker 124 illustrated in FIG. 1 vertically hangs and supports the substrate holder 60. The hanger portions 112 thus hanged and supported of the substrate holder 60 are gripped by the first transporter 142 or the second transporter 144 to convey the substrate holder 60. Note that the substrate holder 60 is hanged and supported to peripheral walls of the prewet tank 126, the presoak tank 128, the cleaning tanks 130a and 130b, the blow tank 132, and the plating tank 10 at the inside of them via the hanger portions 112. Outer contacts 114 for connection to an external power supplying unit are disposed on the hanger portion 112. The outer contacts 114 are electrically connected to holder electric contacts 21 (see FIG. 4) that supply a substrate W with a current via a plurality of wirings inside the substrate holder 60. The plurality of holder electric contacts 21 of the substrate holders 60 are located outside the circumference of the substrate W such that the end portions of the holder electric contacts 21 contact the surface of the substrate W when the substrate W is held to the substrate holder 60. The conducting layer (seed layer) is formed on the surface of the substrate W. When the substrate W is held to the substrate holder 60, the holder electric contacts 21 contact a conductive layer on the surface of the substrate W to allow the current to flow through the substrate W. The outer contacts 114 disposed on the hanger portion 112 mutually contact electric contacts of the hanger receiving members to ensure supplying the current from an external power supply to a surface to be plated of the substrate W via the plurality of holder electric contacts 21 of the substrate holder 60. When the substrate holder 60 is suspended to the hanger receiving members, the outer contacts 114 are disposed at positions not in contact with the plating solution in the plating tank.

The outer contacts 114 can include a plurality of contact terminals, and the plurality of contact terminals may be connected to the plurality of holder electric contacts 21 of the substrate holder 60 with a plurality of wirings so as to correspond on a one-to-one basis. Alternatively, the holder electric contacts 21 may be connected to a busbar inside the substrate holder 60, and the busbar may be electrically connected to the outer contact 114 configured by one contact terminal. In both cases, resistances between the plurality of holder electric contacts 21 and the outer contacts 114 are preferably equal.

The hanger portion 112 having the rectangular parallelepiped shape or the cube shape may be designed such that an application of a force in an upward direction when viewed in FIG. 2 by the substrate holder conveyance device 140 prevents a swing of the substrate holder 60 in motion. When the substrate holder 60 is in the vertical state (the state when a lower end portion 113 of the substrate holder 60 faces the downward direction when viewed in FIG. 2), the top surfaces of the hanger portions 112 become horizontal. The shape of the lower end portion 113 of the substrate holder 60 when viewed from the side surface may be formed into a semicircular shape.

The substrate holder 60 includes the movable holding member 11 as a lid portion and the fixing holding member 15 placed on the fixing unit 120. The substrate W is sandwiched between the movable holding member 11 and the fixing holding member 15. The movable holding member 11 has an approximately circular ring shape and includes a pressing member 12 and the ear portions 13 integrated with the pressing member 12 and projecting toward the outer periphery. The movable holding member 11 is fixable to the fixing holding member 15 and removable from the fixing holding member 15. In FIG. 2, the movable holding member 11 is fixed to the top surface of the fixing holding member 15. The fixing holding member 15 includes the dampers 16 at positions corresponding to the ear portions 13. The damper 16 has an inverted L shape whose distal end is bent inward. Entering (fitting) the ear portions 13 to the insides of the bent portions at the distal ends allows fixing the movable holding member 11 to the fixing holding member 15. The ear portions 13 and the dampers 16 preferably include tapered portions for smooth fitting.

The pressing member 12 is held to the movable holding member 11 to be rotatable and so as not to come off. The pressing member 12 rotates around a center R as a rotational center of the movable holding member 11 together with the ear portions 13 with an approximately horizontal surface as a rotation surface. The pressing member 12 has, for example, an approximately circular ring shape.

The substrate W is sandwiched between the movable holding member 11 and the fixing holding member 15, and the rotation of the pressing member 12 fits the ear portions 13 to the dampers 16 to fix the substrate W. To mount or remove the substrate W, the pressing member 12 is rotated to release the fitting between the ear portions 13 and the dampers 16.

The substrate W is placed on a substrate placement position 14 on the fixing holding member 15. The movable holding member 11 includes a first seal ring 18a and a second seal ring 18b to seal parts such as the end portion and the back surface of the substrate W where the plating is unnecessary against the plating solution. The first seal ring 18a contacts the outer peripheral end of the substrate W, and the second seal ring 18b contacts the surface of the fixing holding member 15. Furthermore, a substrate holder for an electroplating device includes the holder electric contacts 21 in contact with the end region of the substrate sealed with the first seal ring 18a to energize the substrate. The holder electric contacts 21 are electrically connected to the external power supply in a state where the substrate is sandwiched between the movable holding member 11 and the fixing holding member 15. The first seal ring 18a and the second seal ring 18b are held with a seal ring holder 19. For simplification of the following description, there may be a case where the first seal ring 18a and the second seal ring 18b are collectively referred to as a seal ring 18.

To achieve the plating of good in-plane uniformity, uniformly flowing the current through the plurality of holder electric contacts 21 of the substrate holder 60 is necessary. However, a large electrical resistance in one holder electric contact 21 reduces the current flowing through the holder electric contact 21, and a current value flowing through near the holder electric contact 21 increases, resulting in non-uniform plating. The holder electric contact 21 often increases the electrical resistance due to, for example, an attachment of a foreign matter and an oxide to the holder electric contact 21, an attachment of the plating solution to the holder electric contact 21 due to a leakage of the plating solution, a failure of the contact of the holder electric contact 21 to the seed layer of the substrate W by a sufficient contact area due to a deformation and poor mounting of the holder electric contact 21, and a peeling of a coating material on the holder electric contact 21, compared with an electrical resistance in a normal state.

Therefore, this application discloses a resistance measurement module that measures the electrical resistance of the holder electric contact 21 of the substrate holder 60 or a current measuring module 200 that measures the current passing through the holder electric contact 21 of the substrate holder 60. Although the following describes the current measuring module 200 using a current measuring device, the use of a resistance measuring device instead of the current measuring device configures the resistance measurement module; therefore, the following description of the current measuring module is similarly applicable to the resistance measurement module.

First Embodiment

Figure 5:
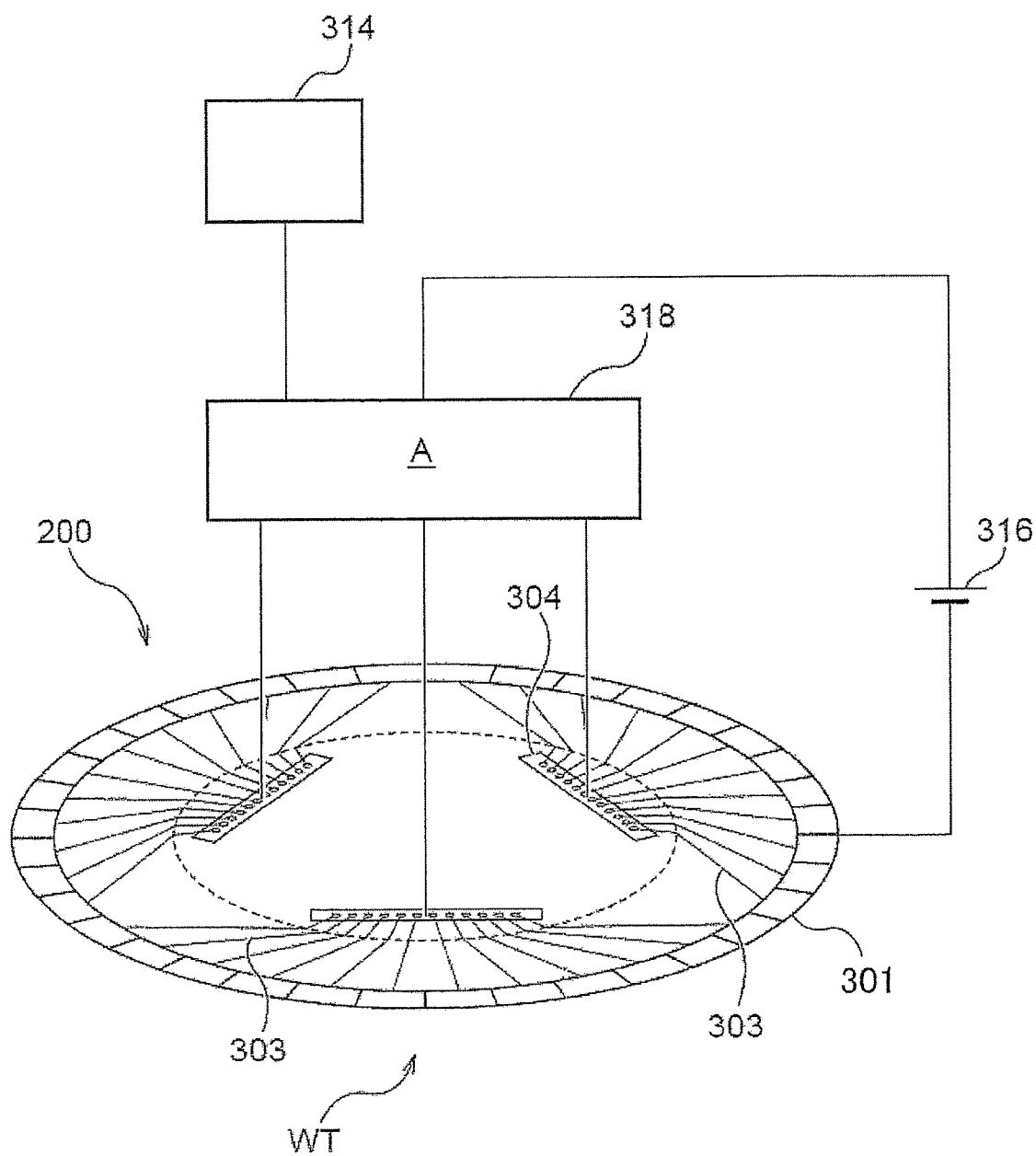
FIG. 5 is a drawing schematically illustrating a current measuring module according to one embodiment.

FIG. 5 is a drawing schematically illustrating the current measuring module 200 according to one embodiment. The current measuring module 200 is a module to measure the electrical resistances of the plurality of respective holder electric contacts 21 of the substrate holder 60 or the currents flowing through the holder electric contacts 21 using an inspection substrate WT described later. Although not illustrated in FIG. 5 for clarification of the illustration, the inspection substrate WT is held to the substrate holder 60, and the currents are supplied from the holder electric contacts 21 to the inspection substrate WT via the outer contacts 114 at the substrate holder 60. As illustrated in FIG. 5, the current measuring module 200 includes a power supply 316, which flows the currents from the respective holder electric contacts 21 of the substrate holder 60 to the inspection substrate WT, and a current measuring device 318 to measure the currents. The current measuring device 318 is connected to a control device 314 including a data logger, a computer, and the like. With the current measuring module 200 built into the plating apparatus, the control device 314 may be hardware identical to the control device 500, which controls the entire plating apparatus. The use of the resistance measuring device instead of the current measuring device 318 configures the resistance measurement module that measures the electrical resistances of the respective holder electric contacts 21 of the substrate holder 60.

Figure 6:
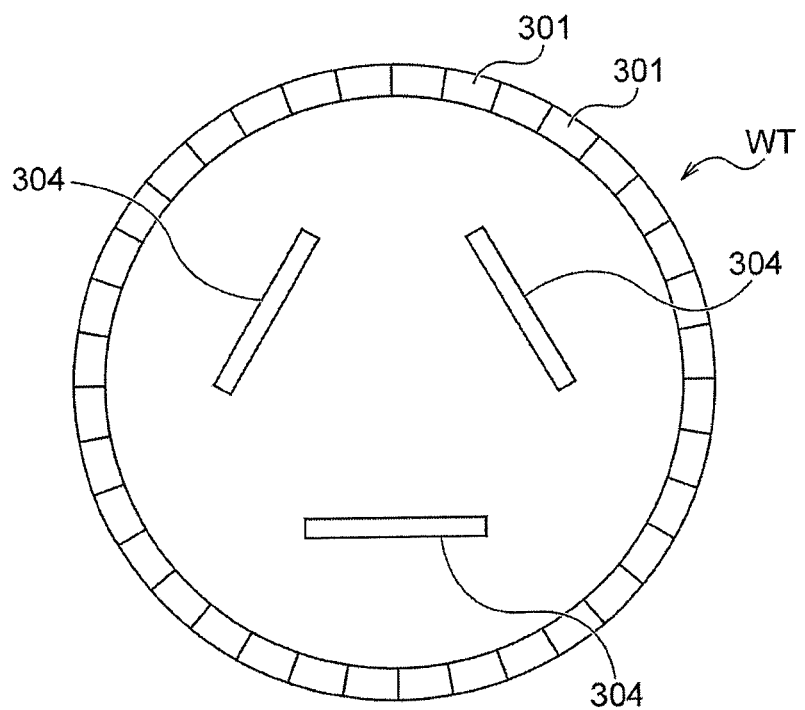
FIG. 6 is a drawing illustrating an inspection substrate according to the one embodiment.
Figure 7:
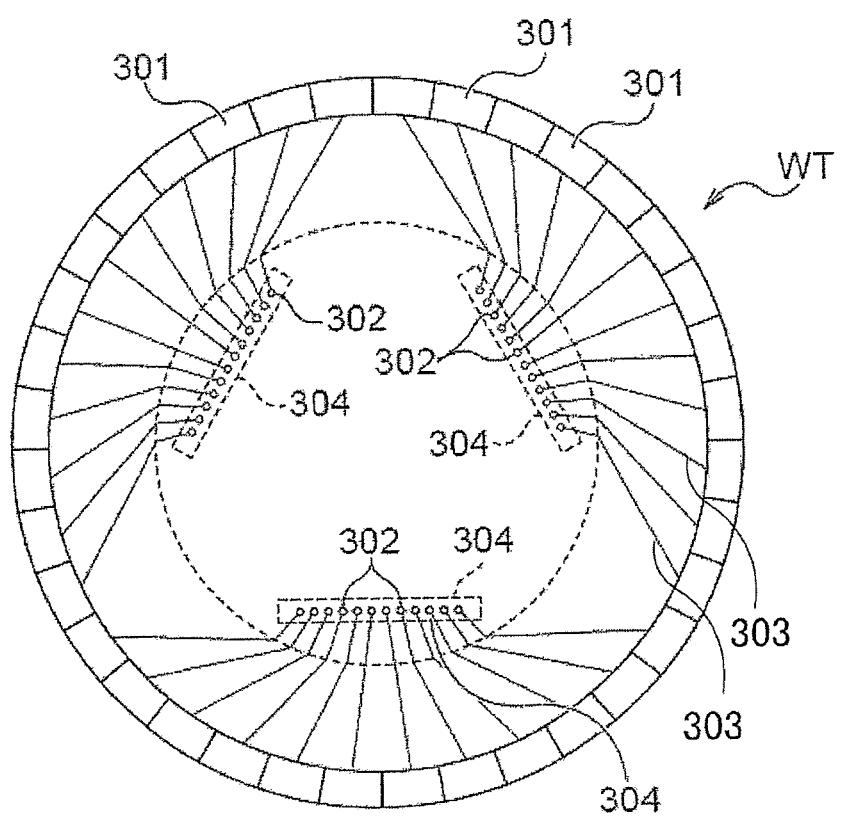
FIG. 7 is a drawing illustrating a wiring structure of the inspection substrate according to the one embodiment.

FIG. 6 is a drawing illustrating the inspection substrate WT. FIG. 7 is a drawing illustrating the wiring structure of the inspection substrate WT. As illustrated in the drawing, the inspection substrate WT is a circular substrate. The inspection substrate WT has dimensions identical to those of the substrate W plated by the plating apparatus. Therefore, the inspection substrate WT can be held to the substrate holder 60. As illustrated in the drawing, the inspection substrate WT includes a plurality of substrate electric contacts 301 on the outer part of the surface. The plurality of substrate electric contacts 301 are each electrically independent. The number of substrate electric contacts 301 is identical to the number of holder electric contacts 21 of the substrate holder 60. With the inspection substrate WT held to the substrate holder 60, the plurality of holder electric contacts 21 of the substrate holder 60 are each connected to the plurality of substrate electric contacts 301 of the inspection substrate WT. As the electric contacts of the substrate holder 60, electric contacts having a configuration in which a part in contact with the substrate W is formed into a plurality of narrow-width claw shapes and bases of the claw-shaped parts are connected to one another are often used. That is, the electric contacts having the identical base portion and the plurally divided distal ends in contact with the substrate W are often used. In this case, the substrate electric contacts 301 of the inspection substrate WT are preferably disposed corresponding to the distal end portions in contact with the substrate W one by one. This allows evaluation of a contact resistance of the distal end portions in contact with the substrate W one by one. Note that the substrate electric contacts 301 of the inspection substrate WT may be disposed such that the plurality of adjacent distal end portions contact the identical substrate electric contact 301. A plurality of measurement points 302 are provided on an inner part of the surface of the inspection substrate WT. The number of measurement points 302 is identical to the number of substrate electric contacts 301. The substrate electric contacts 301 are each connected to the measurement points 302 with wirings 303. As illustrated in the drawing, some of the plurality of substrate electric contacts 301 are connected to one connector 304. The inspection substrate WT illustrated in the drawing includes the three connectors 304, and the substrate electric contacts 301 in each region formed by circumferentially dividing the inspection substrate WT into three are connected to each connector 304. The wirings 303 connecting the respective substrate electric contacts 301 and the measurement points 302 are preferred to have an identical resistance. For example, the wirings 303 are configured so as to have lengths equal to one another.

Figure 8:
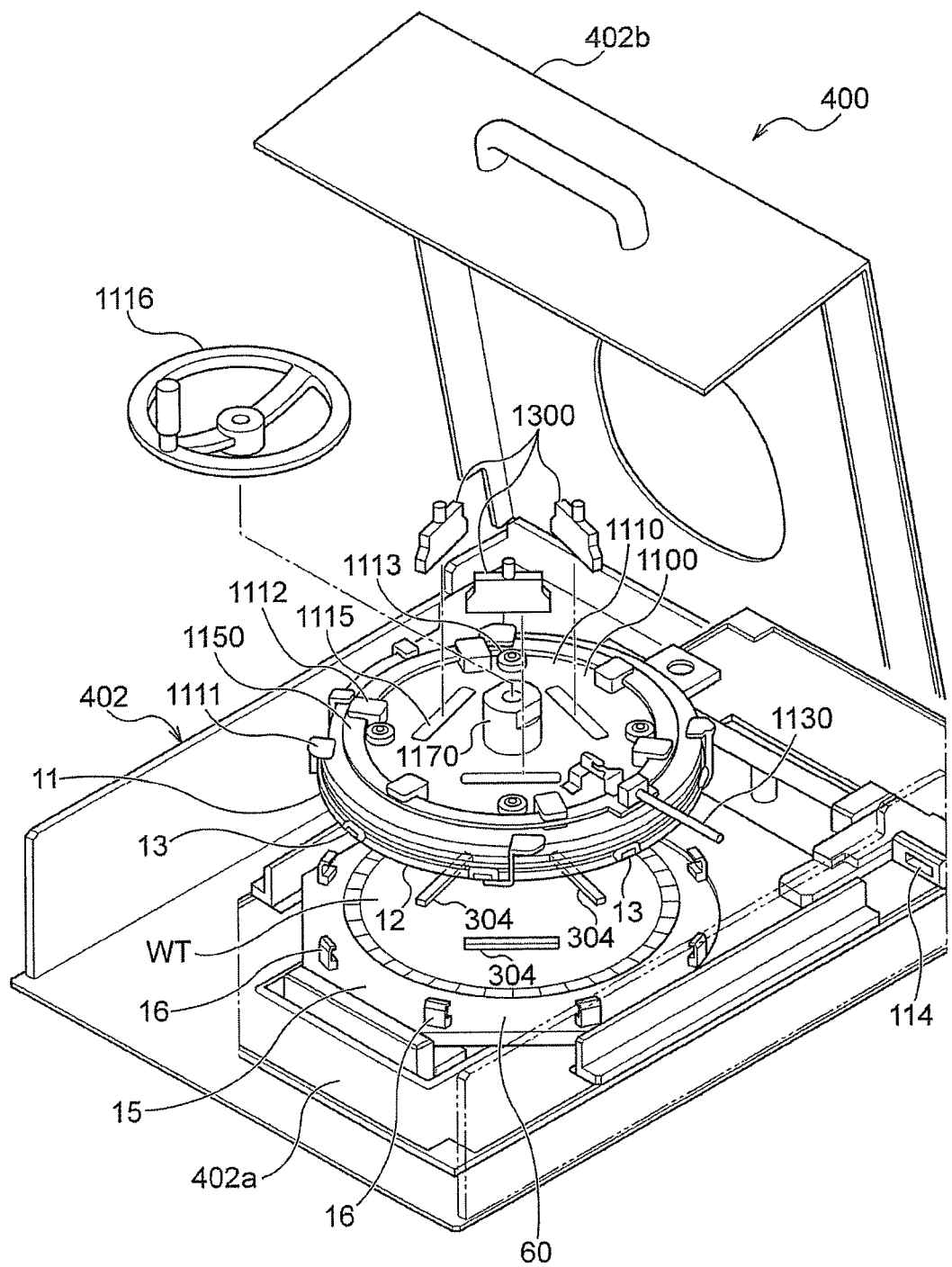
FIG. 8 is a perspective view schematically illustrating a substrate holder open/close mechanism according to the one embodiment.

In one embodiment, the current measuring module 200 can include a substrate holder open/close mechanism 400. FIG. 8 is a perspective view schematically illustrating the substrate holder open/close mechanism 400 according to the one embodiment. As illustrated in FIG. 8, the substrate holder open/close mechanism 400 is located in a casing 402. The casing 402 includes a main body 402a and a cover 402b. The substrate holder open/close mechanism 400 includes a head portion 1100.

The head portion 1100 can hold the movable holding member 11 of the substrate holder 60 placed in the casing 402. The head portion 1100 can rotate the pressing member 12 of the movable holding member 11 of the substrate holder 60 to rotate the ear portions 13, fix the movable holding member 11 to the fixing holding member 15 and release the fixation, and hold the movable holding member 11.

The head portion 1100 includes a pressing circular plate 1110 and a rotating plate 1150 on the pressing circular plate 1110. The pressing circular plate 1110 includes openings 1115 to connect connectors 1300 of the current measuring device 318 to the connectors 304 of the inspection substrate WT. The head portion 1100 includes lifting hooks 1111, rotating plate guides 1112, and guiding rollers 1113. The pressing circular plate 1110 includes a connection boss 1170. To the connection boss 1170, an actuator 1116 to move up and down the head portion 1100 is connected. The actuator 1116 can include a manually operable handle. Alternatively, the actuator 1116 can be an electrically operated actuator configured to perform driving with an electric motor or a fluid driven actuator that includes an air cylinder, a fluid pressure cylinder, and the like.

The rotating plate 1150 has an approximately circular ring shape and is sandwiched with the rotating plate guides 1112 on the pressing circular plate 1110. The rotating plate 1150 is rotatable around a center of a circle of the rotating plate 1150 as the rotational center and with an approximately horizontal surface as the rotation surface. The rotating plate 1150 slidably rotates with the guiding rollers 1113. The head portion 1100 includes a rod-shaped shaft 1130. Moving the shaft 1130 can rotate the rotating plate 1150 on the head portion 1100, fix the movable holding member 11 of the substrate holder 60 to the fixing holding member 15, and release the fixation. The shaft 1130 may be manually moved or an actuator to move the shaft 1130 may be disposed. The actuator to move the shaft 1130, for example, can be an electrically operated actuator configured to perform driving with an electric motor or a fluid driven actuator that includes an air cylinder, a fluid pressure cylinder, and the like.

The rotating plate 1150 is configured to rotate the pressing member 12 and the ear portions 13 in association with the rotation of the rotating plate 1150. When the actuator 1116 connected to the connection boss 1170 moves down the pressing circular plate 1110, the movable holding member 11 of the substrate holder 60 is pressed downward. The movable holding member 11 pressed downward deforms the seal ring 18. Since the movable holding member 11 sinks downward, a clearance for fitting the ear portions 13 at the pressing member 12 to the dampers 16 is generated.

The pressing circular plate 1110 includes the plurality of lifting hooks 1111 on the outside edge. When the head portion 1100 moves up while the ear portions 13 at the movable holding member 11 rotate and move to immediately above lifting portions of the lifting hooks 1111, the ear portions 13 at the movable holding member 11 are lifted up by the lifting hooks 1111, thus moving up the movable holding member 11 together with the head portion 1100. Since this increases the clearance between the movable holding member 11 and the fixing holding member 15, the inspection substrate WT can be placed on the fixing holding member and the inspection substrate WT can be removed from the clearance.

Setting the inspection substrate WT to the substrate holder 60 using the head portion 1100 connects the substrate electric contacts 301 on the inspection substrate WT and the holder electric contacts 21 of the substrate holder 60. Inspection probes (not illustrated) of the current measuring device 318 are connected to the measurement points 302 on the inspection substrate WT via the openings 1115 on the head portion 1100. By connecting the connectors 1300 including the probes of the current measuring device 318 to the connectors 304 of the inspection substrate WT, the connection between the inspection probes of the current measuring device 318 and the measurement points 302 on the inspection substrate WT can be established. The current can be flown through the inspection substrate WT through the substrate holder 60 in such a state. Note that a sensor may be disposed at any of the main body 402a or the cover 402b of the casing 402 to ensure confirmation of the connection state of the main body 402a or the cover 402b, and the current may be configured to flow through the substrate holder 60 only when the cover 402b is connected to the main body 402a. The magnitude of the current can be set to have a magnitude approximately identical to the current flowing through the substrate W when the plating apparatus performs the electroplating on the substrate W. Since the plurality of substrate electric contacts 301 of the inspection substrate WT are each electrically independent, each of the current values flowing through the plurality of holder electric contacts 21 of the substrate holder 60 can be measured. For example, when, as described above, the electric contacts having the shared base and the plurally divided distal ends are used as the electric contacts of the substrate holder 60 and the substrate electric contacts 301 are disposed corresponding to the plurality of divided distal ends, the current values flowing through the respective substrate electric contacts 301 can be measured as the current values of the plurality of holder electric contacts 21 of the substrate holder 60. Therefore, measuring the currents allows detecting an abnormality in the plurality of holder electric contacts 21 of the substrate holder 60. This allows avoiding the plating apparatus to use the substrate holder 60 having the abnormality in the holder electric contact 21. Furthermore, when the holder electric contact 21 of the substrate holder 60 is abnormal, which holder electric contact 21 is abnormal can be identified. In the case where only the specific holder electric contact 21 of the substrate holder 60 is abnormal, only replacing the abnormal holder electric contact 21 ensures reusing the substrate holder 60.

In one embodiment, the current measuring module 200 can be configured as a stand-alone current measuring module where the substrate holder 60 is removed from the plating apparatus and the substrate holder 60 is inspected outside the plating apparatus. As another embodiment, the current measuring module 200 may be installed at the fixing unit 120 in the plating apparatus to ensure inspection of the substrate holder 60 inside the plating apparatus. In this case, the casing 402 of the substrate holder open/close mechanism 400 illustrated in FIG. 5 may be eliminated. When the substrate holder 60 is inspected inside the plating apparatus, the inspection substrate WT is preferably installed to the substrate holder 60 by, for example, a robot for conveyance, without via a hand of a human. In the case where the substrate holder 60 is abnormal, the substrate holder 60 is not used, and the plating process is performed using another normal substrate holder 60, thus ensuring replacing or repairing the abnormal substrate holder 60 during the maintenance of the plating apparatus.

Second Embodiment

Figure 9:
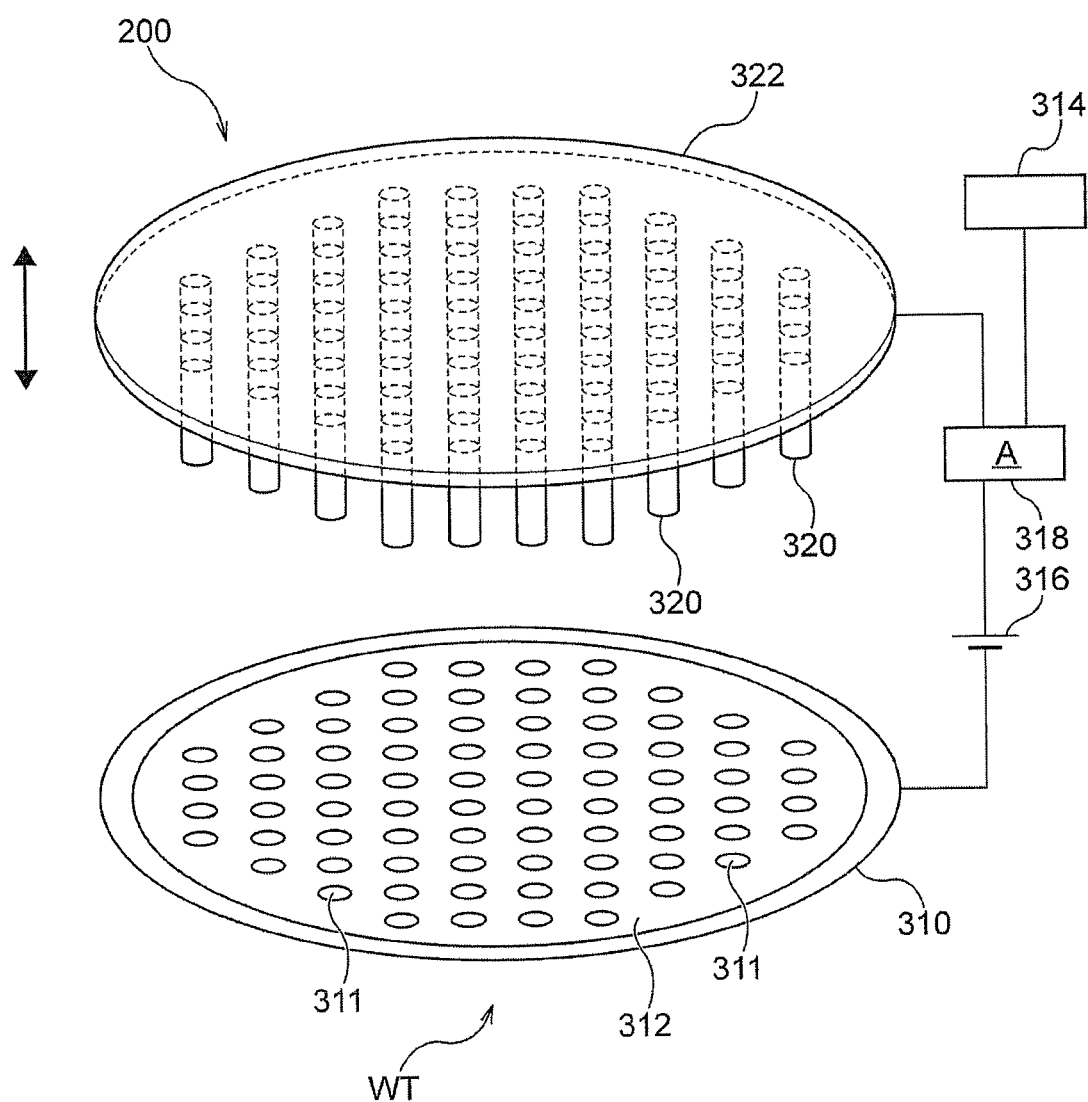
FIG. 9 is a schematic diagram illustrating the current measuring module according to one embodiment.
Figure 10:
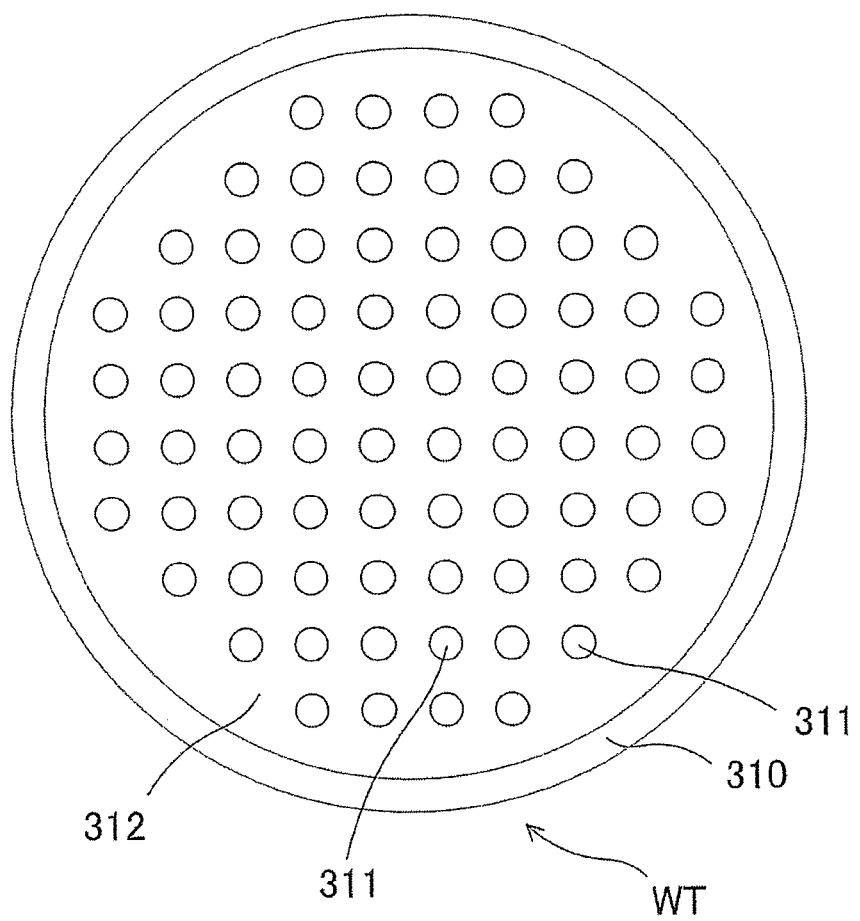
FIG. 10 is a plan view illustrating an inspection substrate WT used for the current measuring module illustrated in FIG. 9.

FIG. 9 is a schematic diagram illustrating the current measuring module 200 according to one embodiment. FIG. 10 is a plan view illustrating the inspection substrate WT used for the current measuring module 200 illustrated in FIG. 9. As illustrated in FIG. 10, the inspection substrate WT includes a conducting layer on an entire base material whose surface has an insulating property. The surface of the conducting layer is additionally covered with an insulating layer 312 excluding an outer peripheral portion 310 and a plurality of inspection regions 311. That is, the conducting layer is exposed at only the outer peripheral portion 310 and the inspection regions 311 on the inspection substrate WT, and the other parts are covered with the insulating layer 312. As the base material, for example, a silicon (Si) substrate including an oxidation layer on the surface can be used. The insulating layer 312 can be formed of, for example, a resist. The plurality of inspection regions 311 on the inspection substrate WT may be disposed, for example, at regions almost corresponding to regions where the substrate is plated by the plating apparatus. The conducting layer of the inspection substrate WT preferably has a thickness approximately equal to that of the conducting layer of the substrate plated by the plating apparatus. As illustrated in FIG. 9, the current measuring module 200 includes a plurality of inspection probes 320. The plurality of inspection probes 320 are supported by a supporting member 322. The supporting member 322 is located so as to face the inspection substrate WT and configured to be movable in a direction perpendicular to the surface of the inspection substrate WT. In one embodiment, the number of inspection probes 320 is configured as the identical number of inspection regions 311 on the inspection substrate WT. Additionally, the current measuring module 200 is configured such that, when the supporting member 322 is moved toward the inspection substrate WT, the plurality of inspection probes 320 each contact the plurality of inspection regions 311 on the inspection substrate WT. Although not illustrated in FIG. 9 for clarification of the illustration of the drawing, the inspection substrate WT is held to the substrate holder 60, and the current can be flown to the inspection substrate WT via the holder electric contacts 21 of the substrate holder 60. The current measuring module 200 illustrated in FIG. 9 can measure the current flowing from the outer peripheral portion 310 of the inspection substrate WT to any given inspection region 311 with the inspection probe 320.

Figure 11:
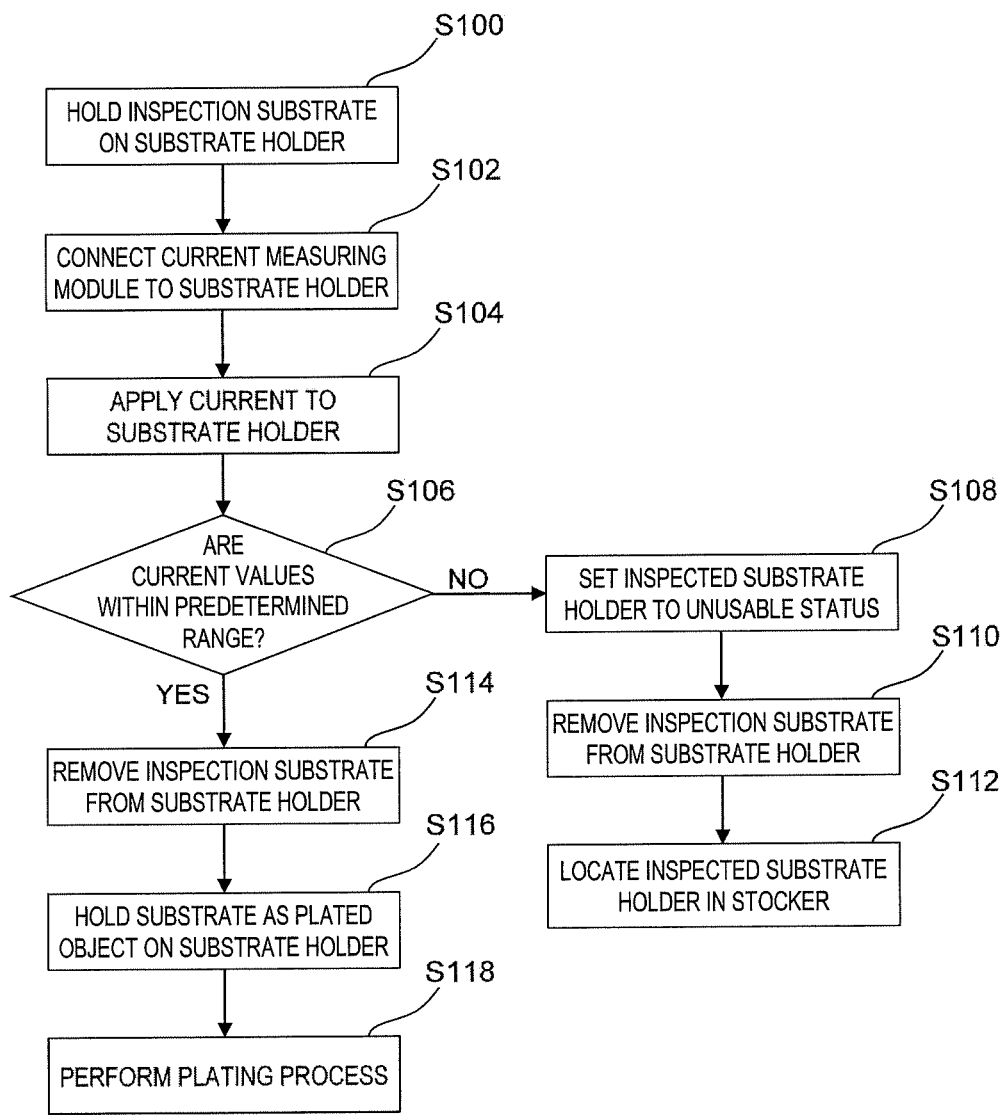
FIG. 11 is a drawing illustrating a flow for an inspection method of the substrate holder according to one embodiment.
Figure 12:
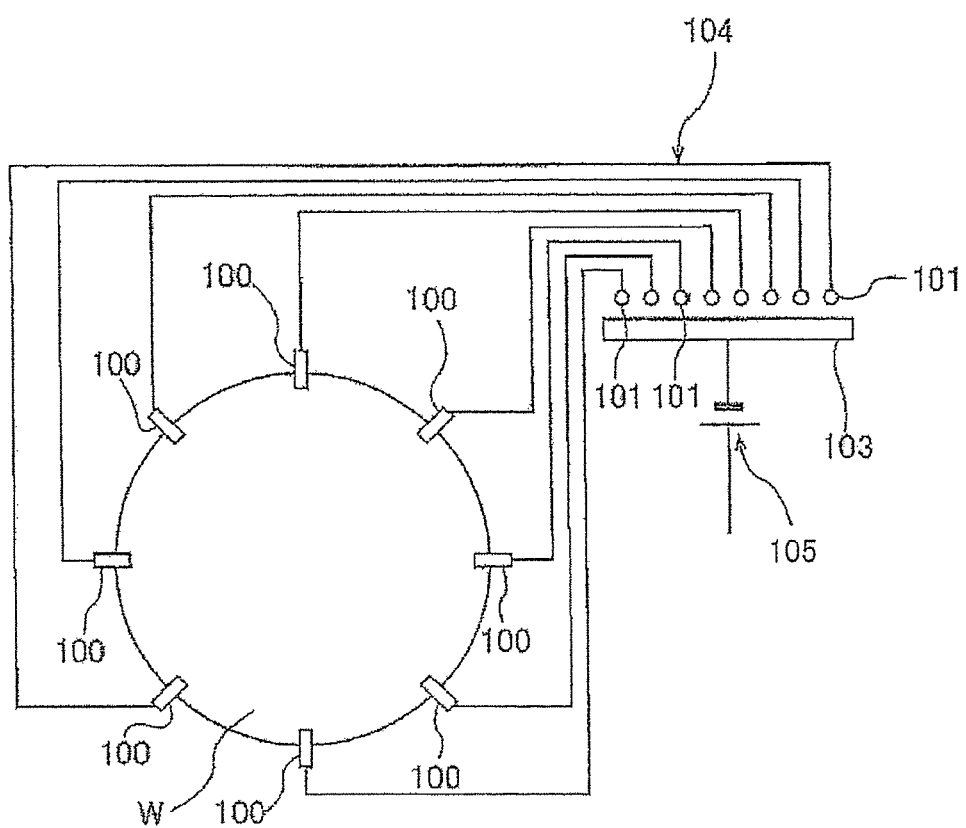
FIG. 12 is a schematic diagram illustrating an electrical path of the substrate holder.

FIG. 11 is a drawing illustrating a flow for an inspection method of the substrate holder according to one embodiment. FIG. 11 illustrates the inspection method for inspection of the substrate holder 60 before the plating process is performed on the substrate W. The inspection method illustrated in FIG. 11 can be performed using the plating apparatus, the substrate holder, the inspection substrate, and the current measuring module according to the above-described embodiments.

First, before starting the plating on the substrate W as the plated object, the inspection substrate WT is held on the substrate holder 60 (S100). The inspection substrate WT can be set to the substrate holder 60 using, for example, the substrate holder open/close mechanism 400 illustrated in FIG. 8. When the current measuring module 200 is located in the plating apparatus, the inspection substrate WT may be set to the substrate holder 60 on the fixing unit 120. Next, the substrate holder 60 on which the inspection substrate WT is held is located at the current measuring module 200 (S102). Next, current is applied to the substrate holder 60 and the inspection substrate WT in the current measuring module 200 to measure the current values flowing through the substrate holder 60 and the inspection substrate WT (S104). With the use of the current measuring module 200 illustrated in FIG. 8, by connecting the connectors 1300 of the measuring device to the connectors 304 of the inspection substrate WT, the inspection probes are brought into contact with the inspection substrate WT to measure the current values of the currents passing through the outer contacts 114 of the substrate holder 60, the wirings inside the substrate holder 60, and the holder electric contacts 21, and then flowing through the measurement points 302 and the inspection regions 311 on the inspection substrate WT. The measured current values are transmitted to the control device 314 and/or 500. Next, the control device 314 and/or 500 determines whether the measured current values are within a predetermined range or not (S106). In one embodiment, the current value flowing through the substrate W through the normal substrate holder 60 during plating is preliminary measured, and the predetermined range can be determined based on the actually measured normal current value. For example, a range within 20% of an average value of the normal current values can be defined as the predetermined range. As one example of the determination, when the current values flowing through all of the respective holder electric contacts 21 of the substrate holder 60 are within the predetermined range, the substrate holder 60 can be determined as normal. Furthermore, when a variation of the current values flowing through the respective holder electric contacts 21 is within 10%, the substrate holders 60 may be determined as normal. For example, the variation can be determined from a difference between the maximum value and the minimum value and the maximum deviation from the average value. It is preferred that the higher a current density of the plating is, the smaller the variation of the current values flowing through the respective holder electric contacts 21 is. Further, when the current values flowing through the respective holder electric contacts 21 are measured, the current value flowing through the identical holder electric contact 21 may be measured multiple times and the average value of the current values may be determined as the current value flowing through the respective holder electric contacts 21. At S108, when the current value flowing through the substrate holder 60 is outside the predetermined range, the substrate holder 60 is set to an unusable status. The substrate holder 60 set to the unusable status by the control device 314, 500 is not used for the plating process. The substrate holder 60 in the unusable status is replaced or repaired during the maintenance. Afterwards, the inspection substrate WT is removed from the substrate holder 60 (S110). At this time, the control device 314, 500 may notify a user of the abnormality in the substrate holder 60 by an alarm, a warning display, or similar method. Since the substrate holder 60 at which the current value is outside the predetermined range is the abnormal substrate holder and therefore cannot be used for the plating process, the substrate holder 60 is returned to the stocker 124 (S112). At S106, when the current value flowing through the substrate holder 60 is in the predetermined range, the inspection substrate WT is removed from the substrate holder 60 (S114) and the substrate W as the plated object is held on this substrate holder 60 (S116). Then, the subsequent plating process is performed on the substrate W held to the substrate holder 60 (S118).

Thus, the used substrate holder 60 can be inspected before the execution of the plating process on the substrate W. This allows preventing a failure of the plating process due to the poor substrate holder 60. The substrate holder 60 determined as failed can be maintained off-line; therefore, the plating process itself can be continuously performed.

With the current measuring module and the inspection substrate WT according to the first embodiment, as long as the resistances of the holder electric contacts 21 of the substrate holder 60, the internal wirings of the substrate holder 60, the wirings 303 inside the inspection substrate WT, and the terminals of the measurement points 302 are equal, when the contact resistances of the respective holder electric contacts 21 of the substrate holder 60 and the respective substrate electric contacts 301 of the inspection substrate WT are good, an equal current should flow ideally. Accordingly, the normal current value to determine the abnormality of the substrate holder 60 is set considering this point. Meanwhile, in the second embodiment, the inspection regions 311 are distributed in the substrate surface and therefore the inspection regions 311 each have different distances from the outer peripheral portion 310. Accordingly, even when the substrate holder 60 is not abnormal, the respective current measurement values at the inspection regions 311 vary by the amount of resistance of the conducting layer. The normal current value to determine the abnormality of the substrate holder 60 is set considering this point. The inspection according to the first embodiment is suitable for simply evaluating the contact state of the holder electric contact 21 of the substrate holder 60. The second embodiment is suitable for determining the abnormality where a layer-thickness distribution (bump height) state as a result of a plating such as bump plating actually performed on a resist opening is compared with a distribution state of the respective current measurement values of the inspection regions 311 to evaluate the current distribution in the substrate surface when the substrate is actually plated in simulation excluding factors such as an electric potential distribution of an anode and an electric potential distribution in the plating solution. In all embodiments, the current values of the inspection substrate are measured using a new substrate holder, and an index of the normal current value to determine the abnormality can be determined based on the average current value of the plurality of substrate holders, and an allowable variation range with respect to the index value may be determined as the normal range.

The embodiments of the present invention have been described above based on some examples in order to facilitate understanding of the present invention without limiting the present invention. The present invention can be changed or improved without departing from the gist thereof, and of course, the equivalents of the present invention are included in the present invention. It is possible to arbitrarily combine or omit respective components according to claims and description in a range in which at least a part of the above-described problems can be solved, or a range in which at least a part of the effects can be exhibited.

REFERENCE SIGNS LIST

11 . . . movable holding member
12 . . . pressing member
13 . . . ear portion
14 . . . substrate placement position
15 . . . fixing holding member
16 . . . damper
18 . . . seal ring
21 . . . holder electric contact
60 . . . substrate holder
112 . . . hanger portion
114 . . . outer contact
120 . . . fixing unit
124 . . . stocker
134 . . . plating cell
140 . . . substrate holder conveyance device
200 . . . current measuring module
301 . . . substrate electric contact
302 . . . measurement point
303 . . . wiring
304 . . . connector
310 . . . outer peripheral portion
311 . . . inspection region 312 . . . insulating layer
314 . . . control device
318 . . . current measuring device
320 . . . inspection probe
322 . . . supporting member
400 . . . substrate holder open/close mechanism
402 . . . casing
500 . . . control device
1300 . . . connector
W . . . substrate
WT . . . inspection substrate

What is claimed is:

1. A current measuring module for measuring a current flowing through a substrate holder using an inspection substrate, wherein
the substrate holder includes a plurality of holder electric contacts, and the plurality of holder electric contacts are configured to contact a substrate to supply the held substrate with a current,
the substrate holder is configured to hold the inspection substrate for measuring the current flowing through the substrate holder, the plurality of holder electric contacts contact a plurality of respective substrate electric contacts disposed on the inspection substrate while the inspection substrate is held, and the plurality of substrate electric contacts are electrically independent,
the inspection substrate includes:
a plurality of measurement points connected to the plurality of respective substrate electric contacts with wirings; and
substrate side connectors electrically connected to the plurality of measurement points,
the current measuring module includes:
a plurality of inspection probes configured to contact the plurality of respective measurement points on the inspection substrate held to the substrate holder; and
measurement side connectors electrically connected to the plurality of inspection probes, and
when the substrate side connectors and the measurement side connectors are connected, each of the plurality of measurement points on the inspection substrate and each of the plurality of respective inspection probes is electrically connected.

2. The current measuring module according to claim 1, wherein
a voltage with a magnitude identical to a magnitude of a voltage applied to the substrate when the substrate is electroplated is applied from the holder electric contacts of the substrate holder to the substrate electric contacts, the wirings, and the measurement points to measure the current flowing through the substrate holder.

3. The current measuring module according to claim 1, wherein
the respective wirings that connect the plurality of substrate electric contacts to the plurality of respective measurement points of the inspection substrate have an equal length.

4. The current measuring module according to claim 1, wherein
the substrate holder includes a plurality of contact holding members electrically independent from one another, and the plurality of holder electric contacts are disposed on the respective contact holding members.

5. A current measuring module for measuring a current flowing through a substrate holder using an inspection substrate, wherein
the substrate holder includes a plurality of holder electric contacts, and the plurality of holder electric contacts are configured to contact a substrate to supply the held substrate with a current,
the substrate holder is configured to hold the inspection substrate for measuring the current flowing through the substrate holder, and the plurality of holder electric contacts contact a plurality of respective substrate electric contacts disposed on the inspection substrate while the inspection substrate is held,
the inspection substrate has a surface coated with an insulating layer, the insulating layer has a plurality of holes, and the inspection substrate includes a conducting layer exposed from the plurality of holes, and
the current measuring module includes inspection probes configured to contact the conducting layer of the inspection substrate held to the substrate holder through the holes.

* * * * *